(12) United States Patent
Dror et al.

(10) Patent No.: US 7,546,510 B2
(45) Date of Patent: Jun. 9, 2009

(54) COMPACT HIGH-SPEED SINGLE-BIT ERROR-CORRECTION CIRCUIT

(75) Inventors: Itai Dror, Omer (IL); Meir Avraham, Rishon Lezion (IL); Boris Dulgunov, Beer Sheva (IL); Eliyahu Fumbarov, Rehovot (IL)

(73) Assignee: Sandisk IL Ltd., Kfar Saba (IL)

( * ) Notice: Subject to any disclaimer, the term of this patent is extended or adjusted under 35 U.S.C. 154(b) by 493 days.

(21) Appl. No.: 10/998,003

(22) Filed: Nov. 29, 2004

(65) Prior Publication Data

US 2005/0160350 A1  Jul. 21, 2005

Related U.S. Application Data

(60) Provisional application No. 60/534,047, filed on Dec. 30, 2003.

(51) Int. Cl.
*H03M 13/29* (2006.01)
(52) U.S. Cl. ........................ 714/755; 714/759
(58) Field of Classification Search .............. 714/755, 714/765, 773, 759
See application file for complete search history.

(56) References Cited

U.S. PATENT DOCUMENTS 5,224,106 A * 6/1993 Weng .................... 714/755

OTHER PUBLICATIONS

Elias, P., "Error-Free Coding", IEEE Transactions on Information Theory, vol. 4, Issue 4, Sep. 1954, pp. 29-37.*
Fuja, T., et al., "Linear Sum Codes for Random Access Memories", IEEE transactions on Computers, vol. 37, No. 9, Sep. 1988, pp. 1030-1042.*
Gaitanis, G., "TSC-error C/D circuits for SEC/DED product codes", IEE Proceedings, vol. 135, Pt. E, No. 5, Sep. 1988, pp. 253-356.*
Deng, R., "New parity retransmission system using product codes", IEE Proceedings, vol. 140, No. 5, Oct. 1993, pp. 351-356.*
Seguin et al., "A Triple Error-Correcting Product Code for Byte-Oriented Information Systems", Proceedings of the IEE, vol. 73, No. 11, Nov. 1995, pp. 1683-1684.*
Litwin et al., "Linear Block Codes", IEEE Potentials Magazine, Feb./Mar. 2001, pp. 29-31.*
New Parity Retransmission System Using Product Codes R.H. Deng IEE Proceedings vol. 140 No. 5 Oct. 1993 pp. 351-356.
TSC Error C/D Circuits for SEC/DED Product Codes N. Gaitanis IEE Proceedings vol. 135 pt E. No. 5 Sep. 5, 1988 pp. 253-258.

(Continued)

*Primary Examiner*—Stephen M Baker
(74) *Attorney, Agent, or Firm*—Mark M. Friedman (57) ABSTRACT

A compact high-speed data encoder/decoder for single-bit forward error-correction, and methods for same. This is especially useful in situations where hardware and software complexity is restricted, such as in a monolithic flash memory controller during initial startup and software loading, where robust hardware and software error correction is not feasible, and where rapid decoding is important. The present invention arranges the data to be protected into a rectangular array and determines the location of a single bit error in terms of row and column positions. So doing greatly reduces the size of lookup tables for converting error syndromes to error locations, and allows fast error correction by a simple circuit with minimal hardware allocation. Use of square arrays reduces the hardware requirements even further.

62 Claims, 3 Drawing Sheets

OTHER PUBLICATIONS

Linear Sum Codes for Random Access Memories Tom Fuja ,Chris Heegard, Rod Goodman, Members of IEEE 1998 IEEE pp. 1030-1042.

Error-Free Coding Peter Elias Dept of Electrical Engineering and Research Laboratory of Electronics MIT Cambridge Massachusetts pp. 29-37.

* cited by examiner

FIG. 3 ized solution to the problem of achieving high speed error-correction decoding with minimal circuit requirements.
COMPACT HIGH-SPEED SINGLE-BIT ERROR-CORRECTION CIRCUIT The present application claims benefit of U.S. Provisional Patent Application No. 60/534,047 filed Dec. 30, 2003

FIELD OF THE INVENTION

The present invention relates to forward error-correcting encoding and decoding and, more particularly, to compact and efficient circuitry for single-bit error correction.

BACKGROUND OF THE INVENTION

In many cases requiring forward error correction, it is desired to use a robust error-correcting code, such as a BCH product code, to provide strong error correction capabilities. Well-known "forward error correction" techniques and codes supplement data intended for one-way transmissions with additional redundant data, to permit the receiver to detect and correct errors up to a predetermined number of errors. The term "forward error correction" is also applied herein to data storage, to permit the retriever of the stored data to detect and correct errors up to a predetermined number of errors. Encoding and decoding according to strong forward error-correcting codes, however, must be done either in software or with complex circuitry. Therefore, where there exist restrictions on the use of software or constraints on the size and complexity of hardware implementations, it may be necessary to use simpler error-detection and error-correction techniques.

As a non-limiting example of the above, data retrieval from a monolithic flash memory exhibits restrictions both on the use of error-correction decoding software and on the complexity of hardware error-correction decoder implementations. At the time of device startup, software loading has not taken place, so decoding cannot be done in software. Moreover, there are strict constraints on the complexity of the hardware circuitry which can be incorporated into the control logic of such devices. Therefore, during device startup, a simple hardware error-correction circuit is needed to bootstrap the software loading so that the more robust decoding can be available for subsequent error detection and correction on retrieved data as well as for error-correction encoding of data to be stored in the device.

This bootstrapping can be done with a code capable of correcting a single-bit error. In the non-limiting examples which are used for illustration in the present application, a Hamming code is employed. For correcting a single bit, only the location of the error is needed, because the magnitude of a bit error is always 1. Thus, without loss of generality, the non-limiting examples in the present application regard only the error location and not the error magnitude. Given the location of an error, it is possible to correct that error by toggling the bit having the specified location. The term "toggling" herein denotes changing a 0-bit into a 1-bit, and vice-versa.

Decoding modern error-correcting codes is typically equivalent to solving the discrete logarithm problem over a polynomial field to derive the error location from a non-zero syndrome. The discrete logarithm problem is believed to be a difficult problem; there is no known general polynomial-time solution for this problem. Instead, there are two practical "brute-force" approaches to solving such a problem, both of which rely on computing a trial syndrome from a trial error location and comparing the trial syndrome with the actual syndrome to determine the actual error location.

The first brute-force approach performs this calculation in real-time using successive trial error locations until the trial syndrome matches the actual syndrome—the final (successful) trial error location is the location of the actual error. The Meggitt decoder is an example of a hardware circuit which uses this first approach. The Meggitt decoder typically has a low gate count, but requires a lot of time to perform the computations and thereby to obtain the error location. As an example, consider a single "sector" of 512 data bytes (4096 bits). For this amount of data, 13 Hamming parity bits are required. The total number of bits is thus 4096+13=4109 bits. Thus, the Meggitt decoder may have to try up to 4109 error locations to find the one matching the given syndrome. On average, the decoder must examine half the memory, or approximately 2055 prospective error locations, before discovering the location of the actual error. This is a highly inefficient use of time.

The second brute-force approach performs the calculation in advance using successive error locations, and saves the results in a table of the error locations for all possible syndromes. Given a syndrome, therefore, a simple lookup in the table obtains the error location immediately. This approach has the advantage of speed but is highly demanding of storage space. For the previous 1-sector example of 512 bytes of data, the table size is determined as follows: The syndrome is 13 bits long, and therefore the table has $2^{13}$=8192 entries. Recalling that there are 4109 bits of data, it is seen that 13 bits are needed to encode a bit position. Thus, there are 8192 entries, each of which is 13 bits, for a total of 106,496 bits of data in the table. In general, for k syndrome bits, the table size is $k*2^k$ bits. This is a highly inefficient use of storage and logic space—a 13 kilobyte table is required for error-correcting half a kilobyte of data.

For regular silicon technology, either of the above approaches is relatively easy and acceptable. However, in the monolithic flash memory with integrated control logic, neither approach is satisfactory. Monolithic flash memory is optimized for the flash memory at the expense of control logic optimization. The result is that the control logic on the integrated chip is slow and of insufficient density to support standard decoding techniques.

There is thus a need for, and it would be highly advantageous to have, a single-bit error-correcting circuit which offers the benefits of both speed and compact hardware implementation. This goal is met by the present invention.

SUMMARY OF THE INVENTION

The present invention is an innovative solution to the problem of achieving high speed error-correction decoding with minimal circuit requirements.

It is an objective of the present invention to minimize the time required to determine the location of a single bit error in a group of data bits. It is also an objective of the present invention to minimize the amount of circuitry required to determine the location of a single bit error in a group of data bits.

The present invention meets both of the above objectives simultaneously by arranging the group of data bits in a rectangular array of r rows and c columns, and computing two (2) forward error-correcting global parity vectors: one global parity vector for the rows collectively, and one global parity vector for the columns collectively. The size of the global row parity vector is determined by c, the number of columns, and the size of the global column parity vector is determined by r, the number of rows. Parity vectors for the individual rows are required only for intermediate, temporary use and are not retained. It is not necessary to compute parity vectors for the individual columns at all.

Thus, two syndromes, a column syndrome and a row syndrome, are computed in the case of error. One or two lookup tables are employed for obtaining the row and column error locations immediately, but the tables are of the order of the square root of the table size for a linear grouping of the data bits, and are therefore much smaller in size.

The last row of data in the data array can be incomplete, so that the number of data bits can be less than the product r*c. In addition, the scheme is optimized when r equals c, because the array is square and only a single table is needed, thereby further reducing the hardware requirements to the minimum. In general, instead of a table size of $k*2^k$ bits, the optimum table size according to the present invention is only $k/2*2^{k/2}$. As a comparison with the example previously presented, instead of a 13-kilobyte lookup table, the present invention requires only $7*2^7=896$ bits for the lookup table, less than a kilobyte, and requiring a small and easily-manageable hardware circuit, less than 7% of the size previously needed.

In the non-limiting case of Hamming codes, used herein as examples, circuit complexity is only about 1700 gates for the 1 sector example, and correction time is very fast, on the order of 5 clock cycles.

Embodiments of the present invention are capable of correcting a single error in the data bits, but can be extended to detect that more than one error has occurred. It is known in the art that the Hamming code can be extended to detect that an even number of errors have occurred, and this extension can also be applied to embodiments of the present invention. If the actual number of data bits is smaller than the maximum number of bits, embodiments of the present invention can, in some cases, also detect the occurrence of 3 errors.

Therefore, according to the present invention there are provided the following:

a method for encoding and protecting data bits against at least one bit error therein, the method including: (a) arranging the data bits logically into a data array having a plurality of rows; (b) computing an individual row parity vector for each of the rows; and (c) computing, and retaining with the data bits, a computed global row parity vector, the computed global row parity vector being a predetermined function of the individual row parity vectors; wherein not all of the individual row parity vectors are retained with the data bits.

a method for decoding data bits and for detecting at least one bit error therein, wherein the data bits are accompanied by an input global row parity vector, the method including: (a) arranging the data bits logically into a data array having a plurality of rows; (b) computing an individual row parity vector for each of the rows; (c) computing a computed global row parity vector, the computed global row parity vector being a predetermined function of the individual row parity vectors; and (d) determining that a bit error exists if the computed global row parity vector differs from the input global row parity vector; wherein the data bits are not accompanied by an individual parity vector corresponding to every one of the rows.

a system for encoding and protecting data bits against at least one bit error therein, the system including: (a) a logical data array for the data bits, the data array having a plurality of rows; (b) a row encoder for computing an individual row parity vector for each of the rows; and (c) a computational module operative to compute a computed global row parity vector, the computed global row parity vector being a predetermined function of the individual row parity vectors.

a system for decoding data bits and detecting at least one bit error therein, wherein the data bits are accompanied by an input global row parity vector, the system including: (a) a logical data array for the data bits, the data array having a plurality of rows; (b) a row encoder for computing an individual row parity vector for each of the rows; (c) a computational module operative to compute a computed global row parity vector, the computed global row parity vector being a predetermined function of the individual row parity vectors; and (d) an error-detection module operative to compare the computed global row parity vector with the input global row parity vector, and to signal an error condition if the computed global row parity vector differs from the input global row parity vector.

a method for encoding and protecting data bits against at least one bit error therein, the method including: (a) arranging the data bits logically into a data array having a plurality of columns; (b) computing an individual column parity vector for each of the columns; and (c) computing, and retaining with the data bits, a computed global column parity vector, the computed global column parity vector being a predetermined function of the individual column parity vectors; wherein not all of the individual column parity vectors are retained with the data bits.

a method for decoding data bits and for detecting at least one bit error therein, wherein the data bits are accompanied by an input global column parity vector, the method including: (a) arranging the data bits logically into a data array having a plurality of columns; (b) computing an individual column parity vector for each of the columns; (c) computing a computed global column parity vector, the computed global column parity vector being a predetermined function of the individual column parity vectors; and (d) determining that a bit error exists if the computed global column parity vector differs from the input global column parity vector; wherein the data bits are not accompanied by an individual parity vector corresponding to every one of the columns.

a system for encoding and protecting data bits against at least one bit error therein, the system including: (a) a logical data array for the data bits, the data array having a plurality of columns; (b) a column encoder for computing an individual column parity vector for each of the columns; and (c) a computational module operative to compute a computed global column parity vector, the computed global column parity vector being a predetermined function of the individual column parity vectors.

a system for decoding data bits and detecting at least one bit error therein, wherein the data bits are accompanied by an input global row parity vector, the system including: (a) a logical data array for the data bits, the data array having a plurality of rows; (b) a row encoder for computing an individual row parity vector for each of the rows; (c) a computational module operative to compute a computed global row parity vector, the computed global row parity vector being a predetermined function of the individual row parity vectors; and (d) a row error-detector operative to compare the computed global row parity vector with the input global row parity vector, and to signal an error condition if the computed global row parity vector differs from the input global row parity vector.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of an error-correcting method, circuit, and system according to the present invention may be understood with reference to the drawings and the accompanying description.

Data Array Structure

Figure 1:
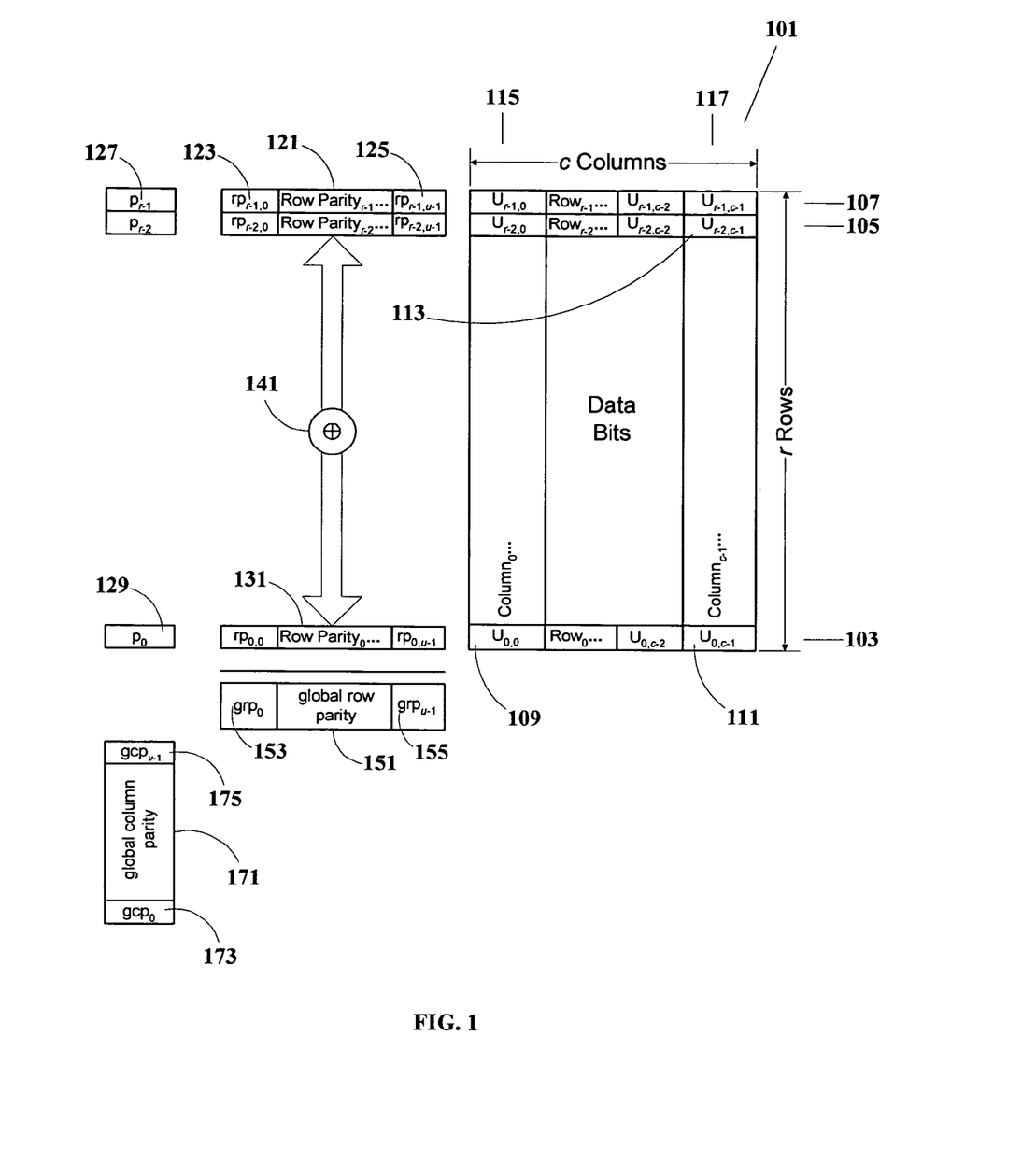
FIG. 1 illustrates a data bit array and code construction scheme according to embodiments of the present invention.

The data bits to be encoded by the present invention are arranged in a rectangular array of data bits 101, having c columns and r rows, as illustrated in FIG. 1. The zero-indexing convention is utilized for non-limiting purposes of illustration in the present application, so that array 101 begins with a $Row_0$ 103, and concludes with a $Row_{r-1}$ 107, which follows a $Row_{r-2}$ 105. Likewise, array 101 begins with a $Column_0$ 115 and concludes with a $Column_{c-1}$ 117. Individual data bits are herein denoted as $U_{r,c}$, wherein the subscript r indicates the row of the data bit, and the subscript c indicates the column of the data bit. A data bit 109 in the first row and the first column, is thus denoted as $U_{0,0}$. A data bit 111 in the first row and the last column is thus denoted as $U_{0,c-1}$, and a data bit 113 in row r2 and column c1 is denoted as $U_{r2,c1}$.

Associated with each row is a row parity vector, which contains error-detection and correction information for that row. Row parity vectors each contain u bits. A row parity vector 121 is illustrated for row 107 (row r−1), whose first bit is a bit 123, denoted as $rp_{r-1,0}$, and whose last bit is a bit 125, denoted as $rp_{r-1,u-1}$. The row parity vector for the first row is a row parity vector 131.

In a non-limiting embodiment of the present invention, all bits of each row are encoded by a Hamming row encoder. The number of parity bits and the order of the Hamming code's generator polynomial are determined by the row size, which is the number of columns c. Each row has c bits, thus the number of parity bits, u satisfies the following equation:

$$c+u-1 \leq 2^u \qquad (1)$$

A polynomial $g_r$ of order u is chosen:

$$g_r(X) = 1 + a_1 X + a_2 X^2 + a_3 X^3 + \ldots + a_{u-1} X^{u-1} + X^u \qquad (2)$$

with coefficients $a_1, a_2, a_3, \ldots, a_{u-1}$ selected from $\{0,1\}$ such that $g_r$ is a primitive polynomial—that is, $g_r$ spans all field elements and cannot be written as the product of polynomials.

Row Encoding

The parity of each row is calculated by the following equation:

$$\begin{aligned}
RowParity_i &= Row_i * X^u \mod g_r(X) \\
&= (U_{i,c-1} * X^{c-1} + U_{i,c-1} * X^{c-2} + \ldots + U_{i,0}) * X^u \mod g_r(X)
\end{aligned} \qquad (3)$$

Returning to FIG. 1, it is seen that there is also a global row parity vector 151, also having u bits, the first bit of which is a bit 153, denoted as $grp_0$, and the last bit of which is a bit 155, denoted as $grp_{u-1}$. Global row parity vector 151 is computed as the bitwise sum of the individual row parity vectors 123 through 131, via a bitwise summing operation 141. The bitwise summing operation adds the individual bit values without a carry, and is obtained via the XOR operation, denoted as ⊕. Because the XOR operation resembles a modular addition, this operation is sometimes referred to as a sum, and the term "adder" may be used to denote a device which performs this operation. Global row parity vector 151 is thus described by the following equation:

$$\text{global row parity vector} = \text{Row Parity}_{r-1} \oplus \text{Row Parity}_{r-2} \ldots \oplus \text{Row Parity}_0 \qquad (4)$$

It is noted that, according to the present invention, the individual row parity vectors Row $Parity_{r-1}$ (row parity vector 121), Row $Parity_{r-2}$ ..., through Row $Parity_0$ (row parity vector 131) are not retained for any further purpose. According to the present invention, only global row parity vector 151 is retained.

Because the code of the present invention can correct only a single bit error, only a single column can have a correctable error, and the global row parity vector locates the column of the error.

It is recognized that the designation of the respective axes of an array as "rows" and "columns" is arbitrary, and that the grouping referred to as "rows" is readily interchangeable with the grouping referred to as "columns" simply by changing the orientation of the array. The present invention treats the axes of the relevant data array in a non-symmetrical fashion, in that the operations performed across one axis are different from the operations performed across the other axis. Accordingly, the terms "row" and "column" are used herein for convenience of description only, and do not limit the present invention regarding the orientation of the array or the application of "row" and "column" designations for the axes. It is understood, therefore, that the term "row" as used herein denotes a first array axis regardless of the orientation thereof, and that the term "column" as used herein denotes a second array axis, regardless of the orientation thereof, such that the first array axis is orthogonal to the second array axis. It is further understood that interchanging the terms "row" and "column" in the discussions, drawings, and examples presented herein describe alternate non-limiting embodiments of the present invention.

Column Encoding

Continuing with the non-limiting embodiment of the present invention, in addition to the row parity vectors, there are overall parity bits for each row. An overall parity bit 127, denoted as $p_{r-1}$, is the overall parity bit for row 107, and an overall parity bit 129, denoted as $p_0$ is the overall parity bit for row 103. The overall parity bits $p_i$ are calculated by performing an XOR operation on all the data bits of the respective $row_i$. A Hamming column encoder encodes these entire overall parity bits. The number of parity bits for the column encoder, which is also the order of the generator polynomial, is determined by:

$$r+v-1 \leq 2^v \qquad (5)$$

where r is the maximum number of rows and v is the number of parity bits. A global column parity vector 171 with a first bit 173, denoted as $gcp_0$, and a last bit 175, denoted as $gcp_{v-1}$, is calculated according to the following equation:

$$\text{global column parity vector} = (p_{r-1}*X^{r-1} + p_{r-2}*X^{r-2} + \ldots + p_0)*X^v \bmod g_c(X) \quad (6)$$

where $p_i$ are the overall parity bits of each row (such as overall parity bit 127), v is the number of parity bits in global column parity vector 171, and $g_c(X)$ is the generator polynomial for global column parity vector 171. It is important to note that the overall parity bits, $p_i$, are not retained for any further purpose. According to the present invention, only global parity vector 171 is retained.

Because the code of the present invention can correct only a single bit error, only a single row can have a correctable error, and the global column parity vector locates the row of the error.

Thus, according to the present invention, it is possible to locate the single bit error by locating the column of the error, as given by the global row parity vector, and by locating the row of the error, as given by the global column parity vector. As previously noted, therefore, it is possible to correct the single bit error by toggling the bit at the given row-column location.

Decoding

Figure 2:
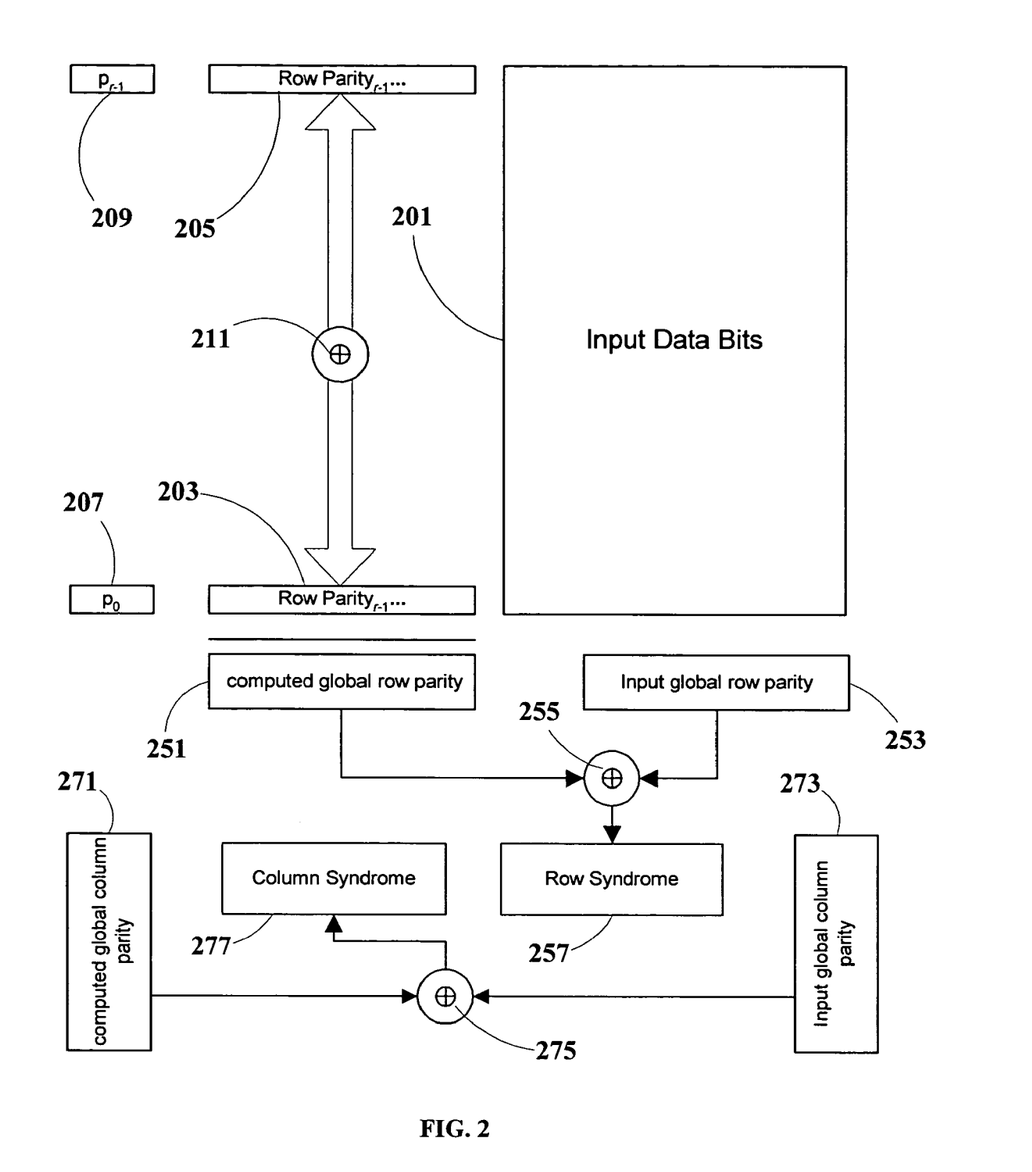
FIG. 2 illustrates the computing of syndromes according to embodiments of the present invention.

The decoding process is similar to the encoding process, in that a global row parity vector is computed in the same manner as previously described, and that a global column parity vector is also computed in the same manner as previously described. There are, however, several additional features, as illustrated in FIG. 2. An array 201 of the input data bits is similar to array 101 as previously detailed and illustrated (FIG. 1). The term "input" when applied to data herein denotes that such data has been presented to a decoder for error detection and correction, according to embodiments of the present invention. That is, this data has been received by the decoder as input. The input data may have been obtained through means including, but not limited to: retrieval from data storage; and reception of a data transmission. In addition to input data bits 201, the decoder is also presented with an input global row parity vector 253 and an input global column parity vector 273, both of which have previously been computed as described above. For example, if input data bits 201 were retrieved from data storage, then input global row parity vector 253 and input global column parity vector 273 are also similarly retrieved from data storage, having been previously computed and stored along with data bits 201 for the purposes of forward error correction. Likewise, if input data bits 201 were obtained from by reception of a data transmission, then input global row parity vector 253 and input global column parity vector 273 are also similarly obtained by reception of a data transmission, having been previously computed and transmitted along with data bits 201 for the purposes of forward error correction.

Further, as indicated above, the decoder independently computes a computed global row parity vector 251, by first computing individual row parity vectors 203 through 205, and then using a bitwise summing operation 211. These computations are done in the manner previously described. Similarly, the decoder also independently computes a computed global column parity vector 271, by first computing individual overall row parity bits 207 through 209, in the manner previously described.

Next, the decoder computes a row syndrome 257 via an XOR operation 255 on input global row parity vector 253 and computed global row parity vector 251. The decoder also computes a column syndrome 277 via an XOR operation 275 on input global column parity vector 273 and computed global column parity vector 271.

If both row syndrome 257 and column syndrome 277 are zero (i.e., contain only zero bits), then it is presumed that no errors have occurred, and thus input data bits 201 are all correct. If, however, row syndrome 257 and column syndrome 277 are non-zero, then these syndromes are converted into an error location. Row syndrome 257 is converted into the column location of the error, and column syndrome 277 is converted into the row location of the error. The erroneous bit can then be corrected as described previously.

According to embodiments of the present invention, the conversion of syndromes to an error locations is done via lookup tables:

$$\text{column error location} = \text{RowTable (row syndrome)} \quad (7)$$

and $$\text{row error location} = \text{ColumnTable (column syndrome)} \quad (8)$$

Recalling that a global row parity vector has u bits, it is seen that RowTable has $2^u$ entries (one for each possible global row parity vector), each of which has u bits. Likewise, given that a global column parity vector has v bits, it is seen that ColumnTable has $2^v$ entries (one for each possible global column parity vector), each of which has v bits. Therefore, the size of RowTable is $u*2^u$ bits, and the size of ColumnTable is $v*2^v$ bits, for a total of $u*2^u + v*2^v$ bits of decoding tables.

If, however, data bit array 101 (FIG. 1) is square, then r=c, whereupon u=v, and the same table can be used for both row and column decoding. Let z=u=v for a square data array, and for this case the total decoding table size is only $z*2^z$ bits.

EXAMPLES

In the following non-limiting examples, a Hamming code is used to implement 1-bit error correction for the frequently-used data block size of 512 bytes. In all of the following examples:

The number of data bits is 512*8=4096 bits.

A square data array of r=c=64 is used, because 64*64=4096 bits.

A Hamming encoder for 64 bits should have z=7 bits in the parity vector, because $64 \leq 2^z - z - 1$, and z=7 is the smallest value that satisfies this inequality—refer to Equation (1) and Equation (5).

The generator polynomial—a prime (non-factorable) polynomial that spans the whole $2^7-1$ finite field—can be: $g(X) = 1 + X^3 + X^7$.

The decoding table for both rows and columns is thus:

TABLE 1

Hamming Code Syndrome Decoding Table for 64-bit data

|     | _0  | _1  | _2  | _3  | _4  | _5  | _6  | _7  | _8  | _9  | _A  | _B  | _C  | _D  | _E  | _F  |
|-----|-----|-----|-----|-----|-----|-----|-----|-----|-----|-----|-----|-----|-----|-----|-----|-----|
| 0_  | 00h | 06h | 05h | 24h | 04h | 42h | 23h | 6Bh | 03h | 0Ah | 41h | 57h | 22h | 12h | 6Ah | 60h |
| 1_  | 02h | 7Eh | 09h | 0Dh | 40h | 51h | 56h | 30h | 21h | 7Bh | 11h | 28h | 69h | 75h | 5Fh | 35h |
| 2_  | 01h | 53h | 7Dh | 77h | 08h | 44h | 0Ch | 14h | 3Fh | 2Dh | 50h | 1Ah | 55h | 46h | 2Fh | 48h |
| 3_  | 20h | 3Dh | 7Ah | 1Dh | 10h | 2Bh | 27h | 5Ah | 68h | 4Eh | 74h | 3Ah | 5Eh | 18h | 34h | 6Fh |
| 4_  | 00h | 0Eh | 52h | 31h | 7Ch | 29h | 76h | 36h | 07h | 25h | 43h | 6Ch | 0Bh | 58h | 13h | 61h |
| 5_  | 3Eh | 1Eh | 2Ch | 5Bh | 4Fh | 3Bh | 19h | 70h | 54h | 78h | 45h | 15h | 2Eh | 1Bh | 47h | 49h |
| 6_  | 1Fh | 5Ch | 3Ch | 71h | 79h | 16h | 1Ch | 4Ah | 0Fh | 32h | 2Ah | 37h | 26h | 6Dh | 59h | 62h |
| 7_  | 67h | 66h | 4Dh | 65h | 73h | 4Ch | 39h | 64h | 5Dh | 72h | 17h | 4Bh | 33h | 38h | 6Eh | 63h |

$z=7$ and $g(X)=1+X^3+X^7$ (all Values in Hexadecimal Notation)

For $z=7$, Table 1 has $2^7=128$ entries, each of 7 bits—the most significant bit of each table entry is zero. The row and column locations of a single-bit error are derived from the values of the entries in Table 1 found at the locations given by the respective 7-bit syndromes.

Furthermore, note the following:
1. The first row is numbered 0, and the last row is numbered 63. Likewise, the first column is numbered 0, and the last column is numbered 63.
2. Because division is performed from the most significant bit (MSB) to the least significant bit (LSB), bit positions of errors are counted from the end of the data.
3. To convert from a data bit position to a row number, divide the bit position by 64 (ignoring the remainder) and subtract the quotient from 63.
4. To convert from a data bit position to a column number, calculate the bit position modulo 64 and subtract the remainder from 63.
5. The parity vectors for the individual rows are considered to be in the first 7 column positions, and the parity vectors for the individual columns are considered to be in the first 7 row positions. Even though, according to the present invention, these parity vectors are not retained, the row and column numbers dedicated to the parity vectors must be accounted for when using the values in Table 1. In cases where the data bits are considered to start at bit 0, this is done by subtracting 7 from those values. That is, if the column numbering is considered to start at column 0:

error column location=Table 1 (row syndrome)−7     (9)

And if the row numbering is considered to start at row 0:

error row location=Table 1 (column syndrome)−7 (10)

This is illustrated in the specific examples below:

In certain embodiments of the present invention, numerical adjustments discussed above are incorporated directly into the tables, thereby eliminating one or more arithmetic operations.

Example 1

Let the correct value of all data bits be 0 (zero). In this case, input global row parity vector 253 (FIG. 2) is 0000000, and input global column parity vector 273 (FIG. 2) is also 0000000.

Now let there be an error in bit $571_{10}$, so that bit $571_{10}$ reads as 1 instead of 0. Using the conversion rules above:

bit $571_{10}$ is in row $55_{10}$ (571 div 64=8; 63−8=55)

bit $571_{10}$ is in column $4_{10}$ (571 mod 64=59; 63−59=4)

With the exception of row $55_{10}$, whose computed row parity vector is 1001100, all individual computed row parity vectors are 0000000. Thus, computed global row parity vector 251 (FIG. 2) is 1001100=4 Ch, which is also the value of row syndrome 257 (FIG. 2).

Using Equation (9) above, it is seen that the decoded column error location is given by:

error column location=Table 1 (4 Ch)−7=0 Bh−7=$4_{10}$.     (11)

Next, the overall parity bits of each row will be 0 (zero) except $p_{55}$, and thus computed global column parity vector 271 (FIG. 2) is 1010000=50 h, which is also the value of column syndrome 277 (FIG. 2).

Using Equation (10) above, it is seen that the decoded row error location is given by:

error row location=Table 1 (50 h)−7=3 Eh−7= $62_{10}$−7=$55_{10}$     (12)

Thus, the decoded error location from Equation (11) and Equation (12) correspond to the location of the error in bit $571_{10}$.

Example 2

In this example, arbitrary data is written and encoded, a portion of which is shown in Table 2. Note that the row and column locations as shown in Table 2 are numbered to take into account the parity vector bits. That is, the data columns are numbered starting at column 7, rather than column 0, and the data rows are numbered starting at row 7, rather than row 0. Furthermore, the data is ordered from MSB to LSB, so the bit strings of the derived row and column locations are backwards and have to reversed before using Table 1.

Also note that the data bit at column 34 and row 13 is written as a 0 (zero). This is the correct value for this data bit.

As previously described, each individual row parity vector is calculated by encoding a row of data. These individual row parity vectors are XORed together, and the result is encoded and saved as the global row parity vector. The overall parity bit is the 1 parity bit of each row, and these overall parity bits are encoded and saved as the global column parity vector. The individual row parity vectors and the overall parity bits are not saved or used any further.

TABLE 2

Data bits as originally written and encoded

| Row | Data (70 ... 34) | Row Parity Vector (7 6 ... 0) | Overall Parity Bit |
|---|---|---|---|
| 14 | 10000011111110101001001001101010111011011011010011111001000000 | 1101000 | 0 |
| 13 | 0001010001101100000010010110001111100010101100011110001011101000 | 1001100 | 0 |
| 12 | 10001111111111010000010010101010111001000010100101100001101011 | 0011101 | 1 |
| 11 | 01101011011001000110111111010000000110110000010101100100001000011 | 0111111 | 1 |
| 10 | 10001001111001100011011110101001100101010010011011010001110111101 | 0111010 | 1 |
| 9  | 11100100100101011111000110100010001110100101100011010000110110110 | 1010001 | 1 |
| 8  | 00000110110110100100110111101011101111000000101000111001100001011 | 0010101 | 0 |
| 7  | 00001001100010010001010110010011101110100010111100000001111100001 | 1000100 | 0 |

Thus, the decoder will be presented with the following input parity vectors:

Input global row parity vector=0111100
Input global column parity vector=1000111

Next, Table 3 shows the same portion of the data bits of Table 2 as read and decoded. Note that the data bit at column 34 and row 13 is erroneously read as a 1. The individual row parity vector and overall parity bit for row 13 consequently differ from those shown in Table 2.

Likewise, the column syndrome is given by:

Column syndrome = input global column parity vector ⊕ computed global column parity vector =

$$1000111 \oplus 0100011 = 1100100$$

TABLE 3

Data bits as subsequently read and decoded

| Row | Data (70 ... 34) | Row Parity Vector (7 6 ... 0) | Overall Parity Bit |
|---|---|---|---|
| 14 | 10000011111110101001001001101010111011011011010011111001000000 | 1101000 | 0 |
| 13 | 0001010001101100000010010110001111101010101100011110001011101000 | 1010100 | 1 |
| 12 | 10001111111111010000010010101010111001000010100101100001101011 | 0011101 | 1 |
| 11 | 01101011011001000110111111010000000110110000010101100100001000011 | 0111111 | 1 |
| 10 | 10001001111001100011011110101001100101010010011011010001110111101 | 0111010 | 1 |
| 9  | 11100100100101011111000110100010001110100101100011010000110110110 | 1010001 | 1 |
| 8  | 00000110110110100100110111101011101111000000101000111001100001011 | 0010101 | 0 |
| 7  | 00001001100010010001010110010011101110100010111100000001111100001 | 1000100 | 0 |

For the input data, the computed parity vectors are:

Computed global row parity vector=0100100
Computed global column parity vector=0100011

Thus, the row syndrome is given by:

Row syndrome = input global row parity vector ⊕ computed global row parity vector $$= 0111100 \oplus 0100100 = 0011000$$

As previously noted, this bit string is backwards because the bit ordering is from MSB to LSB. Reversing 0011000 gives 0001100=0 Ch as the address in Table 1 for looking up the column location of the error.

error column location=Table 1 (0 Ch)=22 h=$34_{10}$. (13)

Reversing 1100100 gives 0010011=13 h as the address in Table 1 for looking up the row location of the error.

error row location=Table 1 (13 h)=0 Dh=$13_{10}$. (14)

Encoder/Decoder System

Figure 3:
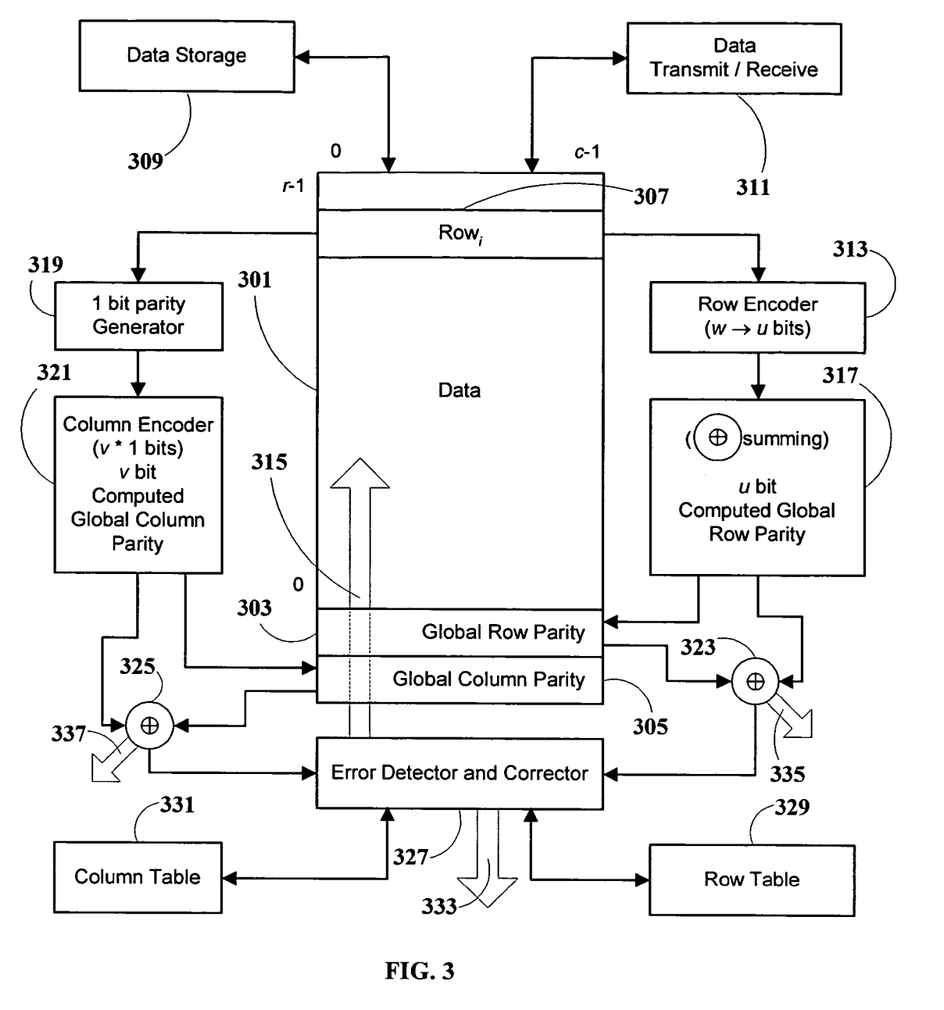
FIG. 3 is a block diagram of an encoder/decoder system according to an embodiment of the present invention.

FIG. 3 is a block diagram of an encoder/decoder system according to an embodiment of the present invention. In one embodiment of the present invention, the encoder/decoder operates both in an encoding mode and in a decoding mode. In another embodiment of the present invention, the system is configured to operate only as an encoder. In still another embodiment of the present invention, the system is configured to operate only as a decoder. The following description relates to the same encoder/decoder system operating in different modes, and the operating principles are applicable to the other embodiments as well.

A block of local data storage 301 is configured so that data bits stored therein are addressed as an array of bits with rows and columns, and also provides a local storage area 303 for a global row parity vector and a local storage area 305 for a global column parity vector. A row of data in data storage 301 has w bits.

In the encoding mode, the encoder/decoder outputs data and associated parity vectors to an external data storage area 309 or to a data transmitter/receiver 311. In the decoding mode, input of data and associated parity vectors can come to the encoder/decoder from data storage area 309 or from data transmitter/receiver 311. Alternatively, in an embodiment of the present invention, local data storage 301 is used to store the data and associated parity vectors both after encoding and before decoding.

A row encoder 313 encodes a Row$_i$ 307 from w bits of data into u bits of parity, and the u-bit parity vector for Row$_i$ is input into an XOR summing unit 317, a computational module which accumulates the individual row parity vectors for each Row$_i$,$0 \leq i \leq (r-1)$ of data into a computed global row parity vector.

In the encoding mode, the encoder/decoder stores the computed global row parity vector in storage area 303 for forward error-correcting use. In the decoding mode, the encoder/decoder retrieves the previously-stored global row parity vector from storage area 303 as the input global row parity vector, and an XOR unit 323 performs an XOR operation whose arguments are the computed global row parity vector from summing unit 317 and the input global row parity vector from storage area 303, to calculate the row syndrome for an error detector and corrector unit 327. XOR unit 323 thus serves as a row syndrome calculator.

For the columns, a single-bit parity generator 319 computes the overall parity bit for row 307, and therefore, as summing unit 317 scans over each Row$_i$,$0 \leq i \leq (r-1)$ of data, single-bit parity generator 319 passes the overall parity bits to a column encoder 321, which encodes r overall row parity bits into v bits of a computed global column parity vector.

In the encoding mode, the encoder/decoder stores the computed global column parity vector in storage area 305 for forward error-correcting use. In the decoding mode, the encoder/decoder retrieves the global column parity vector from storage area 305 as the input global column parity vector, and an XOR unit 325 performs an XOR operation whose arguments are the computed global column parity vector from column encoder 321 and the input global column parity vector from storage area 305, to calculate the column syndrome for error detector and corrector unit 327. XOR unit 325 thus serves as a column syndrome calculator.

Error detector and corrector unit 327 is needed only in the decoding mode, and in that mode, if the syndromes coming from XOR unit 323 and XOR unit 325 are both zero, error detector and corrector unit 327 signals, via an output 333, that there were no errors. Otherwise, if the syndromes coming from XOR unit 323 and XOR unit 325 are both non-zero, error detector and corrector unit 327 signals, via an output 333, that there was an error, and error detector and corrector unit 327, functioning as an error-correction module, attempts to correct the error via a data storage access 315. The error-correction is performed by using a row table 329 and a column table 331, as previously detailed. In an embodiment of the present invention, row table 329 and column table 331 are the same table, as also previously discussed.

In another embodiment of the present invention, the presence of an error is detected by XOR unit 323, functioning as a row error-detector, by comparing the computed global row parity vector from summing unit 317 with the input global row parity vector from storage area 303. If these global row parity vectors are different, unit 323 signals that an error has occurred via an output 335. Unit 323, functioning in this manner, however, cannot correct an error, but can only indicate that an error exists.

Likewise, in still another embodiment of the present invention, the presence of an error is detected by XOR unit 325, also functioning as a simple column error-detector, by comparing the computed global column parity vector from column encoder 321 with the input global column parity vector from storage area 305. If these global column parity vectors are different, unit 325 signals that an error has occurred via an output 337. Unit 325, however, cannot correct an error, but can only indicate that an error exists.

While the invention has been described with respect to a limited number of embodiments, it will be appreciated that many variations, modifications and other applications of the invention may be made.

The invention claimed is:

1. A method for encoding and protecting data bits against at least one bit error therein, the method comprising:
    (a) arranging the data bits logically into a data array having a plurality of rows and a plurality of columns;
    (b) computing an individual row parity vector for each of said rows;
    (c) computing, and retaining with the data bits, a computed global row parity vector, said computed global row parity vector being a predetermined function of said individual row parity vectors;
    (d) computing an overall row parity bit for each of said rows;
    (e) computing, and retaining with the data bits, a computed global column parity vector, said computed global column parity vector being a predetermined function of said overall row parity bits; and
    (f) subsequent to said computing of said computed global column parity vector, discarding at least one of said overall row parity bits;
wherein, if any of said individual row parity vectors are retained with the data bits, fewer than all of said individual row parity vectors are retained with the data bits; and
wherein, if any individual column parity vectors are computed, a number of said individual column parity vectors returned with the data bits is less than a number of said columns.

2. The method of claim 1, wherein said computed global row parity vector is a single parity vector.

3. The method of claim 1, further comprising:
    (g) discarding said individual row parity vectors rather than retaining any of said individual row parity vectors with the data bits.

4. The method of claim 1, wherein said predetermined function of said individual row parity vectors is a sum of said individual row parity vectors.

5. The method of claim 1, wherein said individual row parity vectors are Hamming parity vectors.

6. The method of claim 1, wherein said computed global column parity vector is a single parity vector.

7. The method of claim 1, wherein said computed global column parity vector is a Hamming parity vector.

8. The method of claim 1, further comprising:
    (g) if any said individual column parity vectors are computed, discarding all said individual column parity vectors rather than retaining any said individual column parity vectors with the data bits.

9. A method for decoding data bits and for detecting at least one bit error therein, the method comprising:
    (a) receiving the data bits accompanied by a single input global row parity vector;

(b) arranging the data bits logically into a data array having a plurality of rows;

(c) computing an individual computed row parity vector for each of said rows;

(d) computing a computed global row parity vector, said computed global row parity vector being a predetermined function of said individual computed row parity vectors; and (e) determining that a bit error exists if said computed global row parity vector differs from said input global row parity vector;

wherein, in said receiving, if the data bits are accompanied by any individual input row parity vectors, a total number of said individual input row parity vectors received is less than a total number of said rows.

10. A system for encoding and protecting data bits against at least one bit error therein, the system comprising:

(a) a memory for storing the data bits as a data array having a plurality of rows and a plurality of columns;

(b) a row encoder for computing an individual row parity vector for each of said rows;

(c) a computational module operative to compute a computed global row parity vector, said computed global row parity vector being a predetermined function of said individual row parity vectors;

(d) a one-bit parity generator operative to compute an overall row parity bit for each of said rows;

(e) a column encoder operative to compute a computed global column parity vector, said computed global column parity vector being a predetermined function of said overall row parity bits;

(f) external storage for storing:
  (i) the data bits,
  (ii) said computed global row parity vector, but fewer than all of said individual row parity vectors, and
  (iii) said computed column parity vector but a number of individual column parity vectors that is smaller than a number of said columns.

11. The system of claim 10, wherein said predetermined function of said individual row parity vectors is a sum of said individual row parity vectors, and wherein said computational module is an adder.

12. The system of claim 10, wherein said row encoder is a Hamming encoder.

13. The system of claim 10, wherein said column encoder is a Hamming encoder.

14. The system of claim 10, wherein said external storage is for storing a single said computed global row parity vector.

15. The system of claim 10, wherein said external storage is for storing a single said computed global column parity vector.

16. A method for encoding and protecting data bits against at least one bit error therein, the method comprising:

(a) arranging the data bits logically into a data array having a plurality of columns and a plurality of rows;

(b) computing an individual column parity vector for each of said columns;

(c) computing, and retaining with the data bits, a computed global column parity vector, said computed global column parity vector being a predetermined function of said individual column parity vectors;

(d) computing an overall column parity bit for each of said columns;

(e) computing, and retaining with the data bits, a computed global row parity vector, said computed global row parity vector being a predetermined function of said overall column parity bits; and (f) subsequent to said computing of said computed global row parity vector, discarding at least one of said overall column parity bits;

wherein if any of said individual column parity vectors are retained with the data bits, fewer than all of said individual column parity vectors are retained with the data bits; and wherein, if any individual row parity vectors are computed, a number of said individual row parity vectors returned with the data bits is less than a number of said rows.

17. The method of claim 16, wherein said computed global column parity vector is a single parity vector.

18. The method of claim 16, further comprising:

(g) discarding said individual column parity vectors rather than retaining any of said individual column parity vectors with the data bits.

19. The method of claim 16, wherein said predetermined function of said individual column parity vectors is a sum of said individual column parity vectors.

20. The method of claim 16, wherein said individual column parity vectors are Hamming parity vectors.

21. The method of claim 16, wherein said computed global row parity vector is a single parity vector.

22. The method of claim 16, wherein said computed global row parity vector is a Hamming parity vector.

23. The method of claim 16, further comprising:

(g) if any said individual row parity vectors are computed, discarding all said individual row parity vectors rather than retaining any said individual row parity vectors with the data bits.

24. A method for decoding data bits and for detecting at least one bit error therein, the method comprising:

(a) receiving the data bits accompanied by a single input global column parity vector;

(b) arranging the data bits logically into a data array having a plurality of columns;

(c) computing an individual computed column parity vector for each of said columns;

(d) computing a computed global column parity vector, said computed global column parity vector being a predetermined function of said individual computed column parity vectors; and (e) determining that a bit error exists if said computed global column parity vector differs from said input global column parity vector;

wherein, in said receiving, if the data bits are accompanied by any individual input column parity vectors, a total number of said individual input column parity vectors received is less than a total number of said columns.

25. A system for encoding and protecting data bits against at least one bit error therein, the system comprising:

(a) a memory for storing the data bits as a data array having a plurality of columns and a plurality of rows;

(b) a column encoder for computing an individual column parity vector for each of said columns;

(c) a computational module operative to compute a computed global column parity vector, said computed global column parity vector being a predetermined function of said individual column parity vectors;

(d) a one-bit parity generator operative to compute an overall column parity bit for each of said columns;

(e) a row encoder operative to compute a computed global row parity vector, said computed global row parity vector being a predetermined function of said overall column parity bits; and (f) external storage for storing:
   (i) the data bits,
   (ii) said computed global column parity vector, but fewer than all of said individual column parity vectors, and
   (iii) said computed global row parity vector but a number of individual row parity vectors that is smaller than a number of said rows.

26. The system of claim 25, wherein said predetermined function of said individual column parity vectors is a sum of said individual column parity vectors, and wherein said computational module is an adder.

27. The system of claim 25, wherein said column encoder is a Hamming encoder.

28. The system of claim 25, wherein said row encoder is a Hamming encoder.

29. The system of claim 25, wherein said external storage is for storing a single computed global column parity vector.

30. The system of claim 25, wherein said external storage is for storing a single said computed global row parity vector.

31. A system for encoding and protecting data bits against at least one bit error therein, the system comprising:
   (a) a memory for storing the data bits as a data array having a plurality of rows;
   (b) a row encoder for computing an individual row parity vector for each of said rows;
   (c) a computational module operative to compute a computed global row parity vector, said computed global row parity vector being a predetermined function of said individual row parity vectors; and
   (d) external storage for storing:
      (i) the data bits; and
      (ii) said computed global row parity vector, but not all of said individual row parity vectors;
wherein said external storage is for storing none of said individual row parity vectors.

32. A system for encoding and protecting data bits against at least one bit error therein, the system comprising:
   (a) a memory for storing the data bits as a data array having a plurality of rows and a plurality of columns;
   (b) a row encoder for computing an individual row parity vector for each of said rows;
   (c) a computational module operative to compute a computed global row parity vector, said computed global row parity vector being a predetermined function of said individual row parity vectors;
   (d) a one-bit parity generator operative to compute an overall row parity bit for each of said rows;
   (e) a column encoder operative to compute a computed global column parity vector, said computed global column parity vector being a predetermined function of said overall row parity bits; and
   (f) external storage for storing said computed global column parity vector but a number of individual column parity vectors that is smaller than a number of said columns;
wherein said external storage is for storing said computed global column parity vector without any individual column parity vectors corresponding to any one of said columns.

33. A system for encoding and protecting data bits against at least one bit error therein, the system comprising:
   (a) a memory for storing the data bits as a data array having a plurality of rows;
   (b) a row encoder for computing an individual row parity vector for each of said rows;
   (c) a computational module operative to compute a computed global row parity vector, said computed global row parity vector being a predetermined function of said individual row parity vectors; and
   (d) a communications transmitter operative to transmit the data bits and said computed global row parity vector but at most only some of said individual row parity vectors for each of said rows.

34. The system of claim 33, wherein said communications transmitter is operative to transmit a single said computed global row parity vector.

35. A system for encoding and protecting data bits against at least one bit error therein, the system comprising:
   (a) a memory for storing the data bits as a data array having a plurality of rows and a plurality of columns;
   (b) a row encoder for computing an individual row parity vector for each of said rows;
   (c) a computational module operative to compute a computed global row parity vector, said computed global row parity vector being a predetermined function of said individual row parity vectors;
   (d) a one bit parity generator operative to compute an overall row parity bit for each of said rows;
   (e) a column encoder operative to compute a computed global column parity vector, said computed global column parity vector being a predetermined function of said overall row parity bits; and
   (f) a communications transmitter operative to transmit the data bits and said computed global column parity vector but, if any individual column parity vectors corresponding to said columns are transmitted, operative to transmit fewer said column parity vectors than there are said columns.

36. The system of claim 35, wherein said communications transmitter is operative to transmit a single said computed global column parity vector.

37. The system of claim 35, wherein said communications transmitter is operative to transmit the data bits and said computed global column parity vector without any individual column parity vectors corresponding to any one of said columns.

38. A system for encoding and protecting data bits against at least one bit error therein, the system comprising:
   (a) a memory for storing the data bits as a data array having a plurality of columns;
   (b) a column encoder for computing an individual column parity vector for each of said columns;
   (c) a computational module operative to compute a computed global column parity vector, said computed global column parity vector being a predetermined function of said individual column parity vectors; and
   (d) external storage for storing:
      (i) the data bits, and
      (ii) said computed global column parity vector, but not all of said individual column parity vectors;
wherein said external storage is for storing none of said individual column parity vectors.

39. A system for encoding and protecting data bits against at least one bit error therein, the system comprising:
   (a) a memory for storing the data bits as a data array having a plurality of columns and a plurality of rows;
   (b) a column encoder for computing an individual column parity vector for each of said columns;
   (c) a computational module operative to compute a computed global column parity vector, said computed global column parity vector being a predetermined function of said individual column parity vectors;
   (d) a one-bit parity generator operative to compute an overall column parity bit for each of said columns;

(e) a row encoder operative to compute a computed global row parity vector, said computed global row parity vector being a predetermined function of said overall column parity bits; and (f) external storage for storing said computed global row parity vector but a number of individual row parity vectors that is smaller than a number of said rows;

wherein said external storage is for storing said computed global row parity vector without any individual row parity vectors corresponding to any one of said rows.

40. A system for encoding and protecting data bits against at least one bit error therein, the system comprising:
(a) a memory for storing the data bits as a data array having a plurality of columns;
(b) a column encoder for computing an individual column parity vector for each of said columns;
(c) a computational module operative to compute a computed global column parity vector, said computed global column parity vector being a predetermined function of said individual column parity vectors; and
(d) a communications transmitter operative to transmit the data bits said computed global column parity vector but at most only some of said individual column parity vectors for each of said columns.

41. The system of claim 40, wherein said communications transmitter is operative to transmit a single said computed global column parity vector.

42. A system for encoding and protecting data bits against at least one bit error therein, the system comprising:
(a) a memory for storing the data bits as a data array having a plurality of columns and a plurality of rows;
(b) a column encoder for computing an individual column parity vector for each of said columns;
(c) a computational module operative to compute a computed global column parity vector, said computed global column parity vector being a predetermined function of said individual column parity vectors;
(d) a one-bit parity generator operative to compute an overall column parity bit for each of said columns;
(e) a row encoder operative to compute a computed global row parity vector, said computed global row parity vector being a predetermined function of said overall column parity bits; and
(f) a communications transmitter operative to transmit the data bits and said computed global row parity vector but, if any individual row parity vectors corresponding to said rows are transmitted, operative to transmit fewer said row parity vectors than there are said rows.

43. The system of claim 42, wherein said communications transmitter is operative to transmit a single said computed global row parity vector.

44. The system of claim 42, wherein said communications transmitter is operative to transmit the data bits and said computed global row parity vector without any individual row parity vectors corresponding to any one of said rows.

45. A method for decoding data bits and for detecting at least one bit error therein, the method comprising:
(a) receiving the data bits accompanied by an input global row parity vector;
(b) arranging the data bits logically into a data array having a plurality of rows;
(c) computing an individual computed row parity vector for each of said rows;
(d) computing a computed global row parity vector, said computed global row parity vector being a predetermined function of said individual computed row parity vectors; and
(e) determining that a bit error exists if said computed global row parity vector differs from said input global row parity vector;

wherein the data bits are received without any accompanying individual input row parity vectors.

46. A method for decoding data bits and for detecting at least one bit error therein, the method comprising:
(a) receiving the data bits accompanied by an input global row parity vector;
(b) arranging the data bits logically into a data array having a plurality of rows;
(c) computing an individual computed row parity vector for each of said rows;
(d) computing a computed global row parity vector, said computed global row parity vector being a sum of said individual computed row parity vectors; and
(e) determining that a bit error exists if said computed global row parity vector differs from said input global row parity vector;

wherein, in said receiving, if the data bits are accompanied by any individual input row parity vectors, a total number of said individual input row parity vectors received is less than a total number of said rows.

47. A method for decoding data bits and for detecting at least one bit error therein, the method comprising:
(a) receiving the data bits accompanied by an input global row parity vector;
(b) arranging the data bits logically into a data array having a plurality of rows;
(c) computing an individual computed row parity vector for each of said rows;
(d) computing a computed global row parity vector, said computed global row parity vector being a predetermined function of said individual computed row parity vectors; and
(e) determining that a bit error exists if said computed global row parity vector differs from said input global row parity vector;

wherein, in said receiving, if the data bits are accompanied by any individual input row parity vectors, a total number of said individual input row parity vectors received is less than a total number of said rows;

and wherein said individual computed row parity vectors are Hamming parity vectors.

48. A method for decoding data bits and for detecting at least one bit error therein, the method comprising:
(a) receiving the data bits accompanied by an input global row parity vector and an input global column parity vector;
(b) arranging the data bits logically into a data array having a plurality of rows and a plurality of columns;
(c) computing an individual computed row parity vector for each of said rows;
(d) computing a computed global row parity vector, said computed global row parity vector being a predetermined function of said individual computed row parity vectors;
(e) determining that a bit error exists if said computed global row parity vector differs from said input global row parity vector;
(f) computing an overall row parity bit for each of said rows;
(g) computing a computed global column parity vector, said computed global column parity vector being a predetermined function of said overall row parity bits; and (h) determining that a bit error exists if said computed global column parity vector differs from said input global column parity vector;

wherein, in said receiving, if the data bits are accompanied by any individual input row parity vectors, a total number of said individual input row parity vectors received is less than a total number of said rows.

49. The method of claim 48, wherein said input global column parity vector is a single parity vector.

50. The method of claim 48, wherein said computed global column parity vector is a Hamming parity vector.

51. The method of claim 48, further comprising:
   (i) determining a bit error row location;
   (j) determining a bit error column location; and
   (k) toggling the bit having said bit error row location and said bit error column location.

52. The method of claim 51, wherein said bit error row location is determined by:
   (i) providing a row table for obtaining said bit error row location from a syndrome;
   (ii) computing a column syndrome as a difference of the input global column parity vector and said computed global column parity vector; and
   (iii) obtaining said bit error row location from said column syndrome according to said row table.

53. The method of claim 51, wherein said bit error column location is determined by:
   (i) providing a column table for obtaining said bit error column location from a syndrome;
   (ii) computing a row syndrome as a difference of the input global row parity vector and said computed global row parity vector; and
   (iii) obtaining said bit error column location from said row syndrome according to said column table.

54. A method for decoding data bits and for detecting at least one bit error therein, the method comprising:
   (a) receiving the data bits accompanied by an input global column parity vector;
   (b) arranging the data bits logically into a data array having a plurality of columns;
   (c) computing an individual computed column parity vector for each of said columns;
   (d) computing a computed global column parity vector, said computed global column parity vector being a predetermined function of said individual computed column parity vectors; and
   (e) determining that a bit error exists if said computed global column parity vector differs from said input global column parity vector;
wherein the data bits are received without any accompanying individual input column parity vectors.

55. A method for decoding data bits and for detecting at least one bit error therein, the method comprising:
   (a) receiving the data bits accompanied by an input global column parity vector;
   (b) arranging the data bits logically into a data array having a plurality of columns;
   (c) computing an individual computed column parity vector for each of said columns;
   (d) computing a computed global column parity vector, said computed global column parity vector being a sum of said individual computed column parity vectors; and
   (e) determining that a bit error exists if said computed global column parity vector differs from said input global column parity vector;
wherein, in said receiving, if the data bits are accompanied by any individual input column parity vectors, a total number of said individual input column parity vectors received is less than a total number of said columns.

56. A method for decoding data bits and for detecting at least one bit error therein, the method comprising:
   (a) receiving the data bits accompanied by an input global column parity vector;
   (b) arranging the data bits logically into a data array having a plurality of columns;
   (c) computing an individual computed column parity vector for each of said columns;
   (d) computing a computed global column parity vector, said computed global column parity vector being a predetermined function of said individual computed column parity vectors; and
   (e) determining that a bit error exists if said computed global column parity vector differs from said input global column parity vector;
wherein, in said receiving, if the data bits are accompanied by any individual input column parity vectors, a total number of said individual input column parity vectors received is less than a total number of said columns;
and wherein said individual computed column parity vectors are Hamming parity vectors.

57. A method for decoding data bits and for detecting at least one bit error therein, the method comprising:
   (a) receiving the data bits accompanied by an input global row parity vector and an input global column parity vector;
   (b) arranging the data bits logically into a data array having a plurality of rows and a plurality of columns;
   (c) computing an individual computed column parity vector for each of said columns;
   (d) computing a computed global column parity vector, said computed global column parity vector being a predetermined function of said individual computed column parity vectors;
   (e) determining that a bit error exists if said computed global column parity vector differs from said input global column parity vector;
   (f) computing an overall column parity bit for each of said columns;
   (g) computing a computed global row parity vector, said computed global row parity vector being a predetermined function of said overall column parity bits; and
   (h) determining that a bit error exists if said computed global row parity vector differs from said input global row parity vector;
wherein, in said receiving, if the data bits are accompanied by any individual input column parity vectors, a total number of said individual input column parity vectors received is less than a total number of said columns.

58. The method of claim 57, wherein said input global row parity vector is a single parity vector.

59. The method of claim 57, wherein said computed global row parity vector is a Hamming parity vector.

60. The method of claim 57, further comprising:
   (i) determining a bit error column location;
   (j) determining a bit error row location; and
   (k) toggling the bit having said bit error column location and said bit error row location.

61. The method of claim 60, wherein said bit error column location is determined by:
   (i) providing a column table for obtaining said bit error column location from a syndrome;
   (ii) computing a row syndrome as a difference of the input global row parity vector and said computed global row parity vector; and (iii) obtaining said bit error column location from said row syndrome according to said column table.

62. The method of claim 60, wherein said bit error row location is determined by:
(i) providing a row table for obtaining said bit error row location from a syndrome;
(ii) computing a column syndrome as a difference of the input global column parity vector and said computed global column parity vector; and
(iii) obtaining said bit error row location from said column syndrome according to said row table.

\* \* \* \* \*